(12) United States Patent  
Luo et al.

(10) Patent No.: US 9,147,404 B1  
(45) Date of Patent: Sep. 29, 2015

(54) METHOD AND SYSTEM FOR PROVIDING A READ TRANSDUCER HAVING A DUAL FREE LAYER

(71) Applicant: Western Digital (Fremont), LLC, Fremont, CA (US)

(72) Inventors: Guanghong Luo, Fremont, CA (US); Chen-Jung Chien, Mountain View, CA (US); Ming Mao, Dublin, CA (US); Daniele Mauri, San Jose, CA (US); Ming Jiang, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/675,326

(22) Filed: Mar. 31, 2015

(51) Int. Cl.  
*G11B 5/33* (2006.01)  
*G11B 5/127* (2006.01)  
*G11B 5/60* (2006.01)

(52) U.S. Cl.  
CPC *G11B 5/127* (2013.01); *G11B 5/33* (2013.01); *G11B 5/6082* (2013.01)

(58) Field of Classification Search  
CPC ............. G11B 5/33; G11B 5/39; G11B 5/127  
USPC .................. 360/324.12, 324.11, 324.1, 324.2  
See application file for complete search history.

(56) References Cited

U.S. PATENT DOCUMENTS

| | | |
|---|---|---|
| 5,612,098 A | 3/1997 | Tan et al. |
| 5,717,550 A | 2/1998 | Nepela et al. |
| 5,828,530 A | 10/1998 | Gill et al. |
| 5,876,848 A | 3/1999 | Tan et al. |
| 5,898,547 A | 4/1999 | Fontana, Jr. et al. |
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |

(Continued)

OTHER PUBLICATIONS

Wei Gao, et al., U.S. Appl. No. 13/963,328, filed Aug. 9, 2013, 18 pages.

*Primary Examiner* — Allen T Cao

(57) ABSTRACT

A method provides a magnetic transducer having an air-bearing surface (ABS). The method includes providing a read sensor stack for a read sensor of the read device and defining a read sensor from the read sensor stack in a stripe height direction. The stripe height direction is perpendicular to the ABS. At least one magnetic bias structure is also provided. An insulating layer is deposited on the read sensor. The insulating layer has a full film removal rate of not more than fifty Angstroms per minute. The insulating layer also has a top surface. The insulating layer is planarized. At least a portion of the top surface of the insulating layer being exposed at the start of the planarizing step. At least the read sensor is defined in a track width direction.

17 Claims, 18 Drawing Sheets

(56) References Cited

U.S. PATENT DOCUMENTS

| | | |
|---|---|---|
| 6,103,073 A | 8/2000 | Thayamballi |
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,466,419 B1 | 10/2002 | Mao |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,546 B2 | 7/2003 | Gill |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,631,055 B2 | 10/2003 | Childress et al. |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |

(56) References Cited

U.S. PATENT DOCUMENTS

| | | |
|---|---|---|
| 6,680,828 B2 | 1/2004 | Gill |
| 6,680,830 B2 | 1/2004 | Gill |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,724,584 B2 | 4/2004 | Mack et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,738,236 B1 | 5/2004 | Mao et al. |
| 6,738,237 B2 | 5/2004 | Gill |
| 6,741,432 B2 | 5/2004 | Pinarbasi |
| 6,744,607 B2 | 6/2004 | Freitag et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,751,845 B2 | 6/2004 | Gill |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,798 B2 | 8/2004 | Gill |
| 6,781,927 B1 | 8/2004 | Heanuc et al. |
| 6,785,102 B2 | 8/2004 | Freitag et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,801,412 B2 | 10/2004 | Gill |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,833,982 B2 | 12/2004 | Jayasekara |
| 6,834,010 B1 | 12/2004 | Qi et al. |
| 6,847,510 B2 | 1/2005 | Childress et al. |
| 6,856,493 B2 | 2/2005 | Pinarbasi |
| 6,859,343 B1 | 2/2005 | Alfoqaha et al. |
| 6,859,348 B2 | 2/2005 | Pinarbasi |
| 6,859,997 B1 | 3/2005 | Tong et al. |
| 6,861,937 B1 | 3/2005 | Feng et al. |
| 6,865,062 B2 | 3/2005 | Pinarbasi |
| 6,867,952 B2 | 3/2005 | Hasegawa |
| 6,867,953 B2 | 3/2005 | Gill |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,901,652 B2 | 6/2005 | Hasegawa et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,933,042 B2 | 8/2005 | Gill |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,943,997 B2 | 9/2005 | Gill |
| 6,944,938 B1 | 9/2005 | Crue, Jr. et al. |
| 6,947,258 B1 | 9/2005 | Li |
| 6,947,264 B2 | 9/2005 | Gill |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,983,530 B2 | 1/2006 | Gill |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,016,168 B2 | 3/2006 | Li et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,035,059 B2 | 4/2006 | Gill |
| 7,035,062 B1 | 4/2006 | Mao et al. |
| 7,037,847 B2 | 5/2006 | Le et al. |
| 7,038,889 B2 | 5/2006 | Freitag et al. |
| 7,041,985 B1 | 5/2006 | Wang et al. |
| 7,046,490 B1 | 5/2006 | Ueno et al. |
| 7,050,277 B2 | 5/2006 | Gill et al. |
| 7,054,113 B1 | 5/2006 | Seagle et al. |
| 7,057,857 B1 | 6/2006 | Niu et al. |
| 7,059,868 B1 | 6/2006 | Yan |
| 7,072,154 B2 | 7/2006 | Gill et al. |
| 7,082,017 B2 | 7/2006 | Freitag et al. |
| 7,092,195 B1 | 8/2006 | Liu et al. |
| 7,092,220 B2 | 8/2006 | Gill et al. |
| 7,092,221 B2 | 8/2006 | Gill |
| 7,094,130 B2 | 8/2006 | Cyrille et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,161,773 B2 | 1/2007 | Fontana, Jr. et al. |
| 7,170,725 B1 | 1/2007 | Zhou et al. |
| 7,171,741 B2 | 2/2007 | Gill |
| 7,177,117 B1 | 2/2007 | Jiang et al. |
| 7,177,120 B2 | 2/2007 | Freitag et al. |
| 7,193,815 B1 | 3/2007 | Stoev et al. |
| 7,196,878 B2 | 3/2007 | Fox et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,220,499 B2 | 5/2007 | Saito et al. |

(56) References Cited

U.S. PATENT DOCUMENTS

| | | | |
|---|---|---|---|
| 7,238,292 B1 | 7/2007 | He et al. |
| 7,239,478 B1 | 7/2007 | Sin et al. |
| 7,245,463 B2 | 7/2007 | Gill |
| 7,248,431 B1 | 7/2007 | Liu et al. |
| 7,248,433 B1 | 7/2007 | Stoev et al. |
| 7,248,447 B2 | 7/2007 | Gill |
| 7,248,449 B1 | 7/2007 | Seagle |
| 7,265,946 B2 | 9/2007 | Gill |
| 7,268,980 B2 | 9/2007 | Gill |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,313,856 B2 | 1/2008 | Gill |
| 7,318,947 B1 | 1/2008 | Park et al. |
| 7,324,310 B2 | 1/2008 | Gill |
| 7,330,339 B2 | 2/2008 | Gill |
| 7,333,295 B1 | 2/2008 | Medina et al. |
| 7,337,530 B1 | 3/2008 | Stoev et al. |
| 7,342,752 B1 | 3/2008 | Zhang et al. |
| 7,345,854 B2 | 3/2008 | Takano |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,365,949 B2 | 4/2008 | Hayakawa et al. |
| 7,369,371 B2 | 5/2008 | Freitag et al. |
| 7,370,404 B2 | 5/2008 | Gill et al. |
| 7,371,152 B1 | 5/2008 | Newman |
| 7,372,665 B1 | 5/2008 | Stoev et al. |
| 7,372,674 B2 | 5/2008 | Gill |
| 7,375,926 B1 | 5/2008 | Stoev et al. |
| 7,379,269 B1 | 5/2008 | Krounbi et al. |
| 7,382,589 B2 | 6/2008 | Lin et al. |
| 7,386,933 B1 | 6/2008 | Krounbi et al. |
| 7,389,577 B1 | 6/2008 | Shang et al. |
| 7,405,908 B2 | 7/2008 | Gill |
| 7,405,909 B2 | 7/2008 | Gill |
| 7,417,832 B1 | 8/2008 | Erickson et al. |
| 7,419,610 B2 | 9/2008 | Cyrille et al. |
| 7,419,891 B1 | 9/2008 | Chen et al. |
| 7,420,787 B2 | 9/2008 | Freitag et al. |
| 7,420,788 B2 | 9/2008 | Pinarbasi |
| 7,428,124 B1 | 9/2008 | Song et al. |
| 7,430,098 B1 | 9/2008 | Song et al. |
| 7,436,620 B1 | 10/2008 | Kang et al. |
| 7,436,637 B2 | 10/2008 | Pinarbasi |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,463,459 B2 | 12/2008 | Ding et al. |
| 7,466,524 B2 | 12/2008 | Freitag et al. |
| 7,469,465 B2 | 12/2008 | Ding et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,522,391 B2 | 4/2009 | Freitag et al. |
| 7,522,392 B2 | 4/2009 | Carey et al. |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,580,230 B2 | 8/2009 | Freitag et al. |
| 7,583,466 B2 | 9/2009 | Kermiche et al. |
| 7,595,967 B1 | 9/2009 | Moon et al. |
| 7,599,155 B2 | 10/2009 | Saito et al. |
| 7,602,589 B2 | 10/2009 | Freitag et al. |
| 7,616,411 B2 | 11/2009 | Gill |
| 7,639,457 B1 | 12/2009 | Chen et al. |
| 7,652,856 B2 | 1/2010 | Pinarbasi |
| 7,660,080 B1 | 2/2010 | Liu et al. |
| 7,663,846 B2 | 2/2010 | Freitag et al. |
| 7,672,080 B1 | 3/2010 | Tang et al. |
| 7,672,086 B1 | 3/2010 | Jiang |
| 7,676,905 B2 | 3/2010 | Pinarbasi |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,697,242 B2 | 4/2010 | Gill |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,800,867 B2 | 9/2010 | Saito et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,916,435 B1 | 3/2011 | Gill |
| 7,918,013 B1 | 4/2011 | Dunn et al. |
| 7,961,440 B2 | 6/2011 | Gill et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,068,317 B2 | 11/2011 | Gill |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,149,548 B2 | 4/2012 | Hatatani et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |

(56) References Cited

U.S. PATENT DOCUMENTS

| | | |
|---|---|---|
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,266,785 B2 | 9/2012 | Freitag et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,318,030 B2 | 11/2012 | Peng et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,333,898 B2 | 12/2012 | Brown et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,400,738 B2 | 3/2013 | Covington et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |

(56) References Cited

U.S. PATENT DOCUMENTS

| | | |
|---|---|---|
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2002/0131219 A1 | 9/2002 | Mack et al. |
| 2003/0123198 A1 | 7/2003 | Sugawara et al. |
| 2003/0179520 A1 | 9/2003 | Hasegawa |
| 2004/0061983 A1 | 4/2004 | Childress et al. |
| 2004/0166368 A1 | 8/2004 | Gill et al. |
| 2006/0023375 A1 | 2/2006 | Gill |
| 2006/0092582 A1 | 5/2006 | Gill et al. |
| 2006/0230601 A1 | 10/2006 | Gill et al. |
| 2006/0232893 A1 | 10/2006 | Gill et al. |
| 2006/0285259 A1 | 12/2006 | Gill et al. |
| 2008/0088985 A1* | 4/2008 | Driskill-Smith et al. .. 360/324.2 |
| 2008/0096389 A1* | 4/2008 | Feng et al. .................. 438/692 |
| 2008/0180863 A1 | 7/2008 | Gill |
| 2008/0186626 A1* | 8/2008 | Hong et al. .................. 360/110 |
| 2009/0086385 A1 | 4/2009 | Gill et al. |
| 2009/0316308 A1 | 12/2009 | Saito et al. |
| 2010/0232072 A1 | 9/2010 | Dimitrov et al. |
| 2010/0290157 A1 | 11/2010 | Zhang et al. |
| 2011/0086240 A1 | 4/2011 | Xiang et al. |
| 2011/0228428 A1 | 9/2011 | Dimitrov et al. |
| 2012/0111826 A1 | 5/2012 | Chen et al. |
| 2012/0134057 A1 | 5/2012 | Song et al. |
| 2012/0161263 A1* | 6/2012 | Maat et al. .................. 257/422 |
| 2012/0216378 A1 | 8/2012 | Emley et al. |
| 2012/0237878 A1 | 9/2012 | Zeng et al. |
| 2012/0276415 A1 | 11/2012 | Sapozhnikov et al. |
| 2012/0298621 A1 | 11/2012 | Gao |
| 2013/0082696 A1 | 4/2013 | Le et al. |
| 2013/0092654 A1 | 4/2013 | Balamane et al. |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

\* cited by examiner

ABS View

ABS View

Apex View

ABS View

Apex View

Plan View

ABS View

Apex View

Plan View

ABS View

Apex View

Plan View

ABS View

Apex View

Plan View

ABS View

Apex View

Plan View

ABS View

Apex View

Plan View

ABS View

Apex View

Plan View

ABS View

Apex View

Plan View

ABS View

Apex View

Plan View

ABS View

Apex View

Plan View

ABS View

Apex View

Plan View

ABS View

Apex View

Plan View

ABS View

Apex View

METHOD AND SYSTEM FOR PROVIDING A READ TRANSDUCER HAVING A DUAL FREE LAYER

BACKGROUND

FIG. 1 depicts an air-bearing surface (ABS) view of a read transducer used in magnetic recording technology applications. The read transducer 10 includes shields 12 and 18, insulator 14, side magnetic bias structures 16, and sensor 20. The read sensor 20 shown is a dual free layer sensor. In other cases, the read sensor 20 is a giant magnetoresistive (GMR) sensor or tunneling magnetoresistive (TMR) sensor. In such cases, the read sensor 20 may include an antiferromagnetic (AFM) layer, a pinned layer, a nonmagnetic spacer layer, and a free layer. Capping and seed layer(s) may also be used. The free layer has a magnetization sensitive to an external magnetic field. Thus, the free layer functions as a sensor layer for the magnetoresistive sensor 20. If the sensor 20 is to be used in a current perpendicular to plane (CPP) configuration, then current is driven in a direction substantially perpendicular to the plane of the layers. Conversely, in a current-in-plane (CIP) configuration, then conductive leads (not shown) would be provided on the magnetic bias structures 16.

FIG. 2 depicts a method for providing the transducer 10. Referring to FIGS. 1 and 2, the sensor stack is deposited, via step 52. Thus, the layers for the sensor 20 are provided. The read sensor 20 is defined in the track width direction. The track width direction is otherwise known as the cross-track direction. Thus, the sidewalls and track width, TW, of the sensor 20 are formed. The side bias structures 16 are then provided, via step 56. Step 56 may include depositing the insulator 14 and forming the bias structures 16.

After the side bias structures 14 are formed, the read sensor 20 is then defined in the stripe height direction, via step 58. Thus, the stripe height, SH, of the sensor 20 is set. If a dual free layer sensor 20 is to be fabricated, then a rear bias structure (not shown in FIG. 1) is then provided, via step 60. Step 60 includes depositing the magnetic materials for the rear bias structure. This is typically carried out while the mask used for step 58 is in place.

After step 60 is performed, an aluminum oxide refill layer and metal chemical mechanical planarization (CMP) stop layer are deposited, via step 62. The mask used for step 58 is then desired to be removed and a flat surface provided for subsequent processing. Thus, a mill open and CMP process are performed, via step 64. The mill open ion mills the transducer 10 at a high angle from normal to the surface of the transducer. Thus, the material(s) on the side of the mask used for step 58 are removed. The mask may then be lifted off and a CMP performed. The CMP stops on the metal CMP stop layer. Without the CMP stop layer, the aluminum oxide has a high removal rate on the order of 0.1-0.3 microns per minute. Thus, as long as the metal CMP stop layer is used, a flat surface may be provided while protecting the rear bias and other structures from damage.

Although the conventional method functions, there may be drawbacks. Accordingly, what is needed is an improve method for fabricating a magnetic recording read transducer.

BRIEF DESCRIPTION OF SEVERAL VIEWS OF THE DRAWINGS

FIGS. 7A, 7B and 7C through 20A, 20B and 20C depicts plan, ABS and apex (side) views of other exemplary embodiments of a portion of a magnetic recording read transducer during fabrication.

DETAILED DESCRIPTION OF THE PREFERRED EMBODIMENTS

Figure 1:
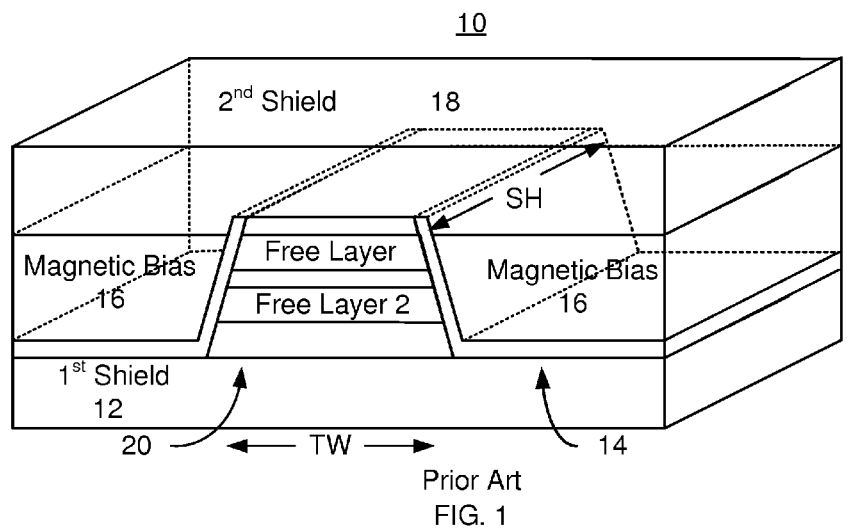
FIG. 1 depicts a conventional read transducer.
Figure 2:
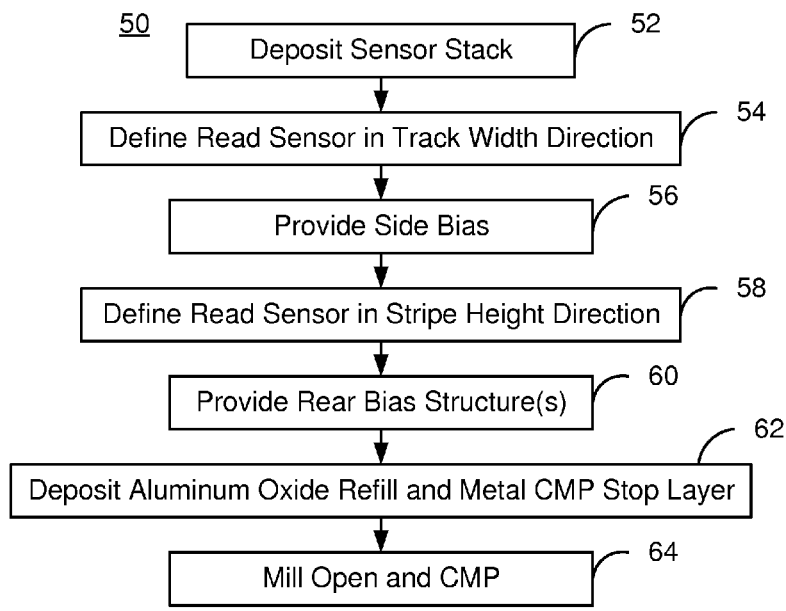
FIG. 2 is a flow chart of a conventional method for fabricating a read transducer.
Figure 3:
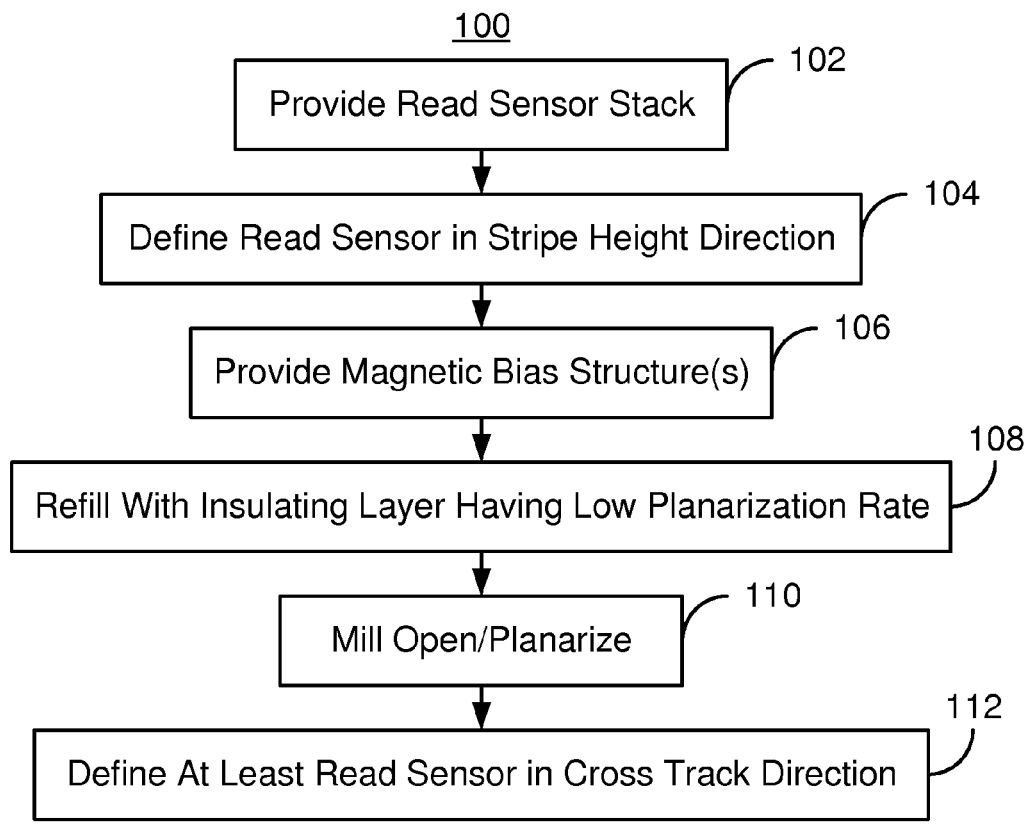
FIG. 3 is flow chart depicting an exemplary embodiment of a method for fabricating a magnetic recording read transducer.

FIG. 3 is an exemplary embodiment of a method 100 for providing a read transducer. For simplicity, some steps may be omitted, interleaved, performed in another order and/or combined. The method 100 is also described in the context of providing a single recording transducer. However, the method 100 may be used to fabricate multiple transducers at substantially the same time. The method 100 is also described in the context of particular layers. A particular layer may include multiple materials and/or multiple sub-layers. The method 100 also may start after formation of other portions of the magnetic recording transducer. For example, in some embodiments, a soft, ferromagnetic shield and a nonmagnetic spacer layer, such as aluminum oxide, are provided first.

The read sensor stack is provided, via step 102. Step 102 typically includes depositing the layers for the read sensor. For a dual free layer read sensor, step 102 includes depositing materials for the free layers, the nonmagnetic spacer layer between the free layers, and for any other layers in the stack such as seed and/or capping layers. If a conventional spin valve or tunneling magnetoresistive junction is formed, then step 102 may include depositing the materials for the AFM layer, pinned layer, nonmagnetic spacer/tunneling barrier layer and free layer.

The sensor is defined in the stripe height direction, via step 104. Step 104 includes covering a portion of sensor stack that includes the read sensor. This portion may include the ABS and extend a distance equal to the desired stripe height in the stripe height direction (perpendicular to the ABS). The sensor stack is then ion milled. Thus, the rear surface of the read sensor opposite to the ABS is defined in step 104. Stated differently, the stripe height of the read sensor is defined.

At least one magnetic bias structure is provided, via step 106. Step 106 may include providing a rear magnetic bias structure used to magnetically bias the read sensor in a direction perpendicular to the ABS. The read sensor is between the rear magnetic bias structure and the ABS. An insulator may also be deposited such that the insulator is between the rear surface of the read sensor and the rear bias structure. In some embodiments, deposition of the insulator may include providing an aluminum oxide layer using atomic layer deposition. The rear magnetic bias structure may be a soft magnetic bias structure, a hard magnetic bias structure or include both. A soft magnetic bias structure may include a soft magnet having a coercivity of less than one hundred Oe. In some embodiments, the coercivity of the soft magnetic bias structure is less than ten Oe. The hard magnetic bias structure includes a hard magnet having a coercivity of greater than one hundred Oe. The coercivity of the hard magnetic bias structure may also be greater than one thousand Oe. In some embodiments, step 106 may include providing the side magnetic bias structures. In such embodiments, portions of step 106 may be interleaved with other steps or step 106 may be performed at a different time. For example, if both the rear and side bias structures are considered to be fabricated in step 106, then a portion of step 106 (formation of the side bias structures) occurs after step 112, discussed below. Another portion of step 106 (formation of the rear bias structure) occurs after step 104.

A refill step is performed, via step 108. The refill of step 108 includes depositing an insulating layer that has a low full film removal rate due to a planarization process, such as a CMP. The full film removal rate of the insulating layer is not more than fifty Angstroms per minute. In some embodiments, the full film removal rate is not more than twenty Angstroms per minute. In some such embodiments, the full film removal rate is at least three Angstroms per minute. Thus, the full film removal rate of the insulating layer deposited in step 108 may be on the order of one hundred times less than the aluminum oxide used in the conventional method 50. The refill may include depositing the insulating layer without providing a metal cap/planarization stop layer on the insulating layer. Thus, the insulating layer may have a top surface that is exposed after step 108 is completed. The insulating layer provided in step 108 may consist of at least one of silicon nitride, silicon dioxide and tantalum pentoxide. In embodiments in which a rear bias structure is provided, at least part of the insulating layer may be on the rear bias structure as well as the read sensor. In other embodiments, the rear bias structure may not be used. For example, the method 100 may be used or a tunneling magnetoresistive sensor having a pinned layer with a larger stripe height than the free layer ("extended pinned layer configuration"). In the extended pinned layer configuration, part of the insulating layer may reside on the extended pinned layer. In such embodiments, the insulating layer may be adjacent to the rear surface of the read sensor.

The insulating layer is planarized, via step 110. In some embodiments, step 110 also includes performing an ion mill/open step to remove the mask used in step 104. For example, the insulating layer and layers for the magnetic bias structure(s) deposited in step 106 may undergo a mill at a high angle with respect to a normal to the top surface of the insulating layer. The mask used in step 106 may then be lifted off. A planarization such as a CMP is then performed. In other embodiments, the planarization alone may be performed. At least a portion of the top surface of the insulating layer is exposed at the start of the planarization in step 110.

At least the read sensor is defined in the track width (cross-track) direction, via step 112. Step 112 may include defining not only track width of the read sensor, but also width the rear magnetic bias structure provided in step 106. Thus, the rear magnetic bias structure and the read sensor may be self-aligned. The rear magnetic bias structure and read sensor may share widths, to within processing limitations if the mask used has a single width. However, in other embodiments, the portion of the mask covering the rear bias structure may have a different (e.g. wider) width than the portion covering the read sensor. In such cases, the widths of the rear bias and the read sensor are different. The track width of the read sensor may, for example, be not more than thirty nanometers. In some such embodiments, the track width and the rear magnetic bias structure width, may be not more than twenty nanometers. The length of the rear bias structure may also be significantly larger than its width. For example, the length may be at least four multiplied by the width. In some such embodiments, the length is at least ten multiplied by the width.

Using the method 100, the magnetic bias structure(s) and read sensor may be fabricated. Use of an insulating layer having a low full film removal rate in lieu of a combination of an insulator and a metal stop layer may simplify the fabrication process. In addition, any step height between the planarized insulating layer and the top of the read sensor after step 110 may be reduced. Thus, a flatter surface may be provided for subsequent processing, including definition of the read sensor track width in step 112. Moreover, use of the insulating layer may improve formation of the mask used in defining the read track width in step 112. Because no metal capping layer may be used, a less varied surface having a more consistent optical contrast are present before formation of a photoresist mask used in track width definition. Thus, photolithography may be improved. Consequently, controllability and manufacturability may be improved.

Figure 4A:
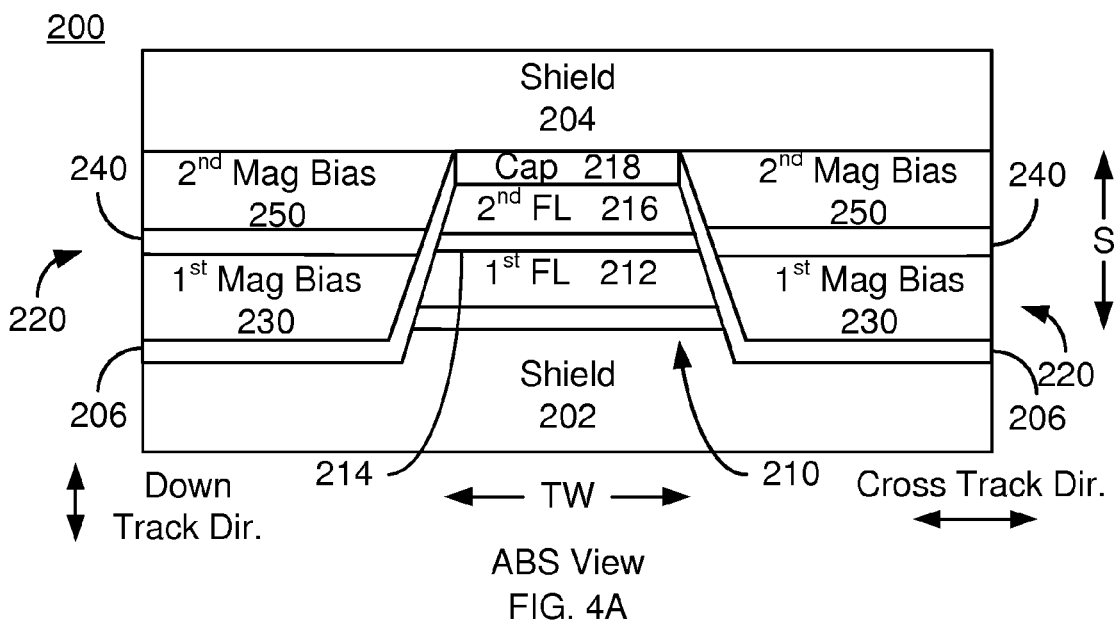
FIGS. 4A-4C are ABS, plan and side views of an exemplary embodiment of a portion of a magnetic recording read transducer.
Figure 4B:
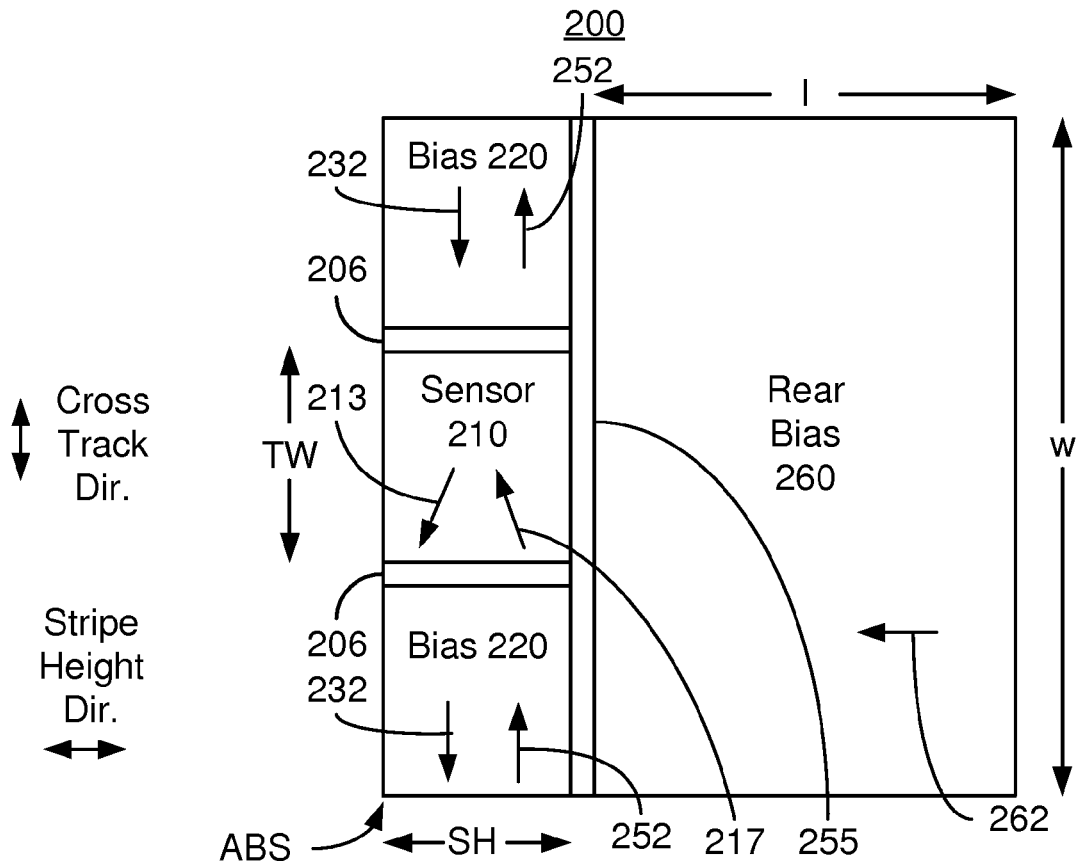
Figure 4C:
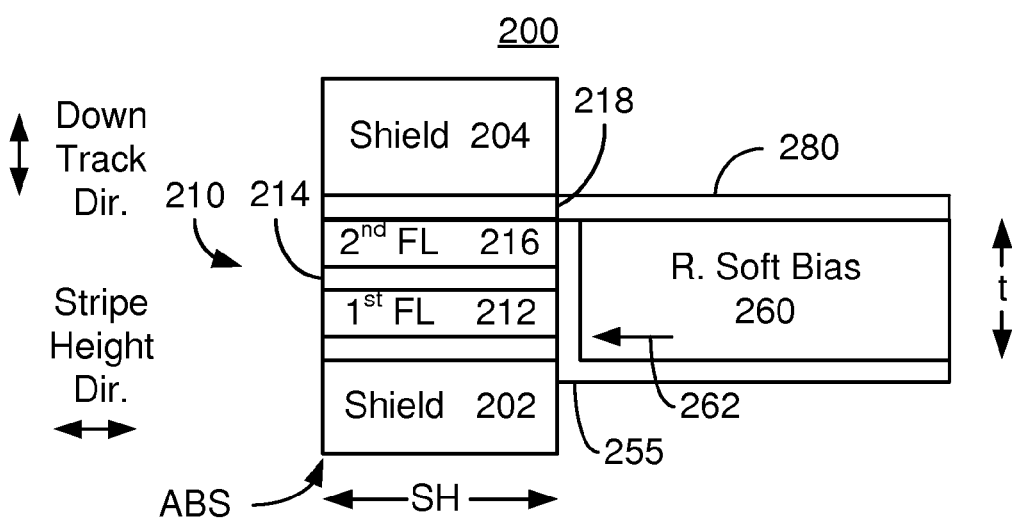

FIGS. 4A-4C depict ABS, plan and side views of an exemplary embodiment of a portion of a magnetic read transducer 200. For clarity, FIGS. 4A-4C are not to scale. The read transducer 200 may be part of a read head or may be part of a merged head that also includes a write transducer. The head of which the read transducer 200 is a part is contained in a disk drive having a media, a slider and the head coupled with the slider. Further, only a portion of the components of the read transducer 200 are depicted.

The transducer 200 includes optional soft magnetic shields 202 and 204, insulator 206, read sensor 210, side bias structures 220 and rear bias structure 260 that may be separated from the read sensor 210 by an insulating layer 255. The rear bias structure 260 is at least partially covered by the insulating layer 280. The side bias structures 220 include antiferromagnetically aligned magnetic bias structures 230 and 250. The read sensor 210 includes a first free layer 212 and a second free layer 216 separated by a nonmagnetic spacer layer 214. The nonmagnetic spacer layer 214 may be conductive or an insulating tunneling barrier layer, such as MgO. The free layers 212 and 216 are ferromagnetic and may include multiple layers. The free layers 212 and 216 are biased such that their magnetic moments 213 and 217, respectively are in a scissor mode. The read sensor 210 may also be configured for high density recording. Thus, in some embodiments, the track width (TW) of the read sensor 210 is not more than thirty nanometers. In some such embodiments, the track width is not more than twenty nanometers.

The transducer 200 includes side magnetic bias structures 220/230/250 and a rear magnetic bias structure 260 that together magnetically bias the free layers 212 and 216 in a scissor mode. The side bias structure 230 has magnetic moment 232 that biases the free layer magnetic moment 213 parallel to the ABS, in the cross-track direction. The side bias structure 250 has magnetic moment 252 that biases the free layer magnetic moment 217 parallel to the ABS, in the cross-track direction. The magnetic moments 232 and 252 also bias the free layer magnetic moments 213 and 217, respectively, antiparallel. In some embodiments, the magnetic moments 213 and 217 of the free layers 212 and 216 are antiferromagnetically coupled. The rear magnetic bias structure 260 biases the magnetic moments 213 and 217 of the free layers 212 and 216, respectively, perpendicular to the ABS, in the stripe height direction.

The magnetic transducer 200 also includes a rear magnetic bias structure 260 that may be fabricated in step 106. The rear bias structure may be a soft magnetic bias structure, a hard magnetic bias structure, or include both soft and hard magnetic bias structures. For example, a hard magnetic bias structure may be a magnetic structure having a coercivity of greater than one hundred Oersted. In some embodiments, the hard magnetic bias structure coercivity is at least one thousand Oersted. In contrast, a soft magnetic bias structure may have a coercivity of less than one hundred Oersted. In some embodiments, the soft magnetic bias structure coercivity is not more than ten Oersted. The hard and soft bias structure may include single alloys, multiple layer(s), a mixed-composition alloy and/or other components. Other components, such as a pinning structure, may be included in the rear bias structure 260. A pinning structure is a magnetic component used to magnetically bias other portions of the rear magnetic bias structure 260. For example, the pinning structure might be an AFM layer.

The read sensor 210 is between the rear bias structure 260 and the ABS. Further, an insulating layer 255 may separate the rear bias structure 260 from the sensor 210 and bias structures 220. Such an insulating layer 255 may be used if the rear bias structure 260 is conductive. In addition, although the shields 202 and 204 are shown as extending only to the stripe height of the sensor 210, the shields 202 and 204 generally extend significantly further in the stripe height direction. However, the shields 202 and 204 are also magnetically decoupled from the rear bias structure 260. Thus, the insulating layer 255 and a top insulating 280 may extend along the depth of the rear bias structure 260. For example, in some embodiments, the insulating layer 255 is at least ten Angstroms and not more than forty Angstroms thick. The insulating layer 255 is also nonmagnetic. Thus, the read sensor 210 may be electrically insulated from the rear bias structure 260 and not exchanged coupled with the rear soft bias structure 260.

The rear bias structure 260 is shown having a width, w, in the cross-track direction; a length, l, in the stripe height direction and a thickness, t in the down track direction. In the embodiment shown, the rear bias structure 260 extends to the edges of the side bias structures 220. However, in other embodiments, the width of the rear bias structure 260 may differ, depending upon the width of the portion of the mask covering the rear bias structure 260 during definition in the cross-track direction. For example, in other embodiments, the width of the rear bias structure 260 may be substantially equal to the track width, TW, of the read sensor 210. Thus, the rear bias structure 260 and sensor 210 may be self-aligned, but may have different widths. In addition, the length, l, is generally greater than the width (l>w). Thus, the rear bias structure 260 may have a shape anisotropy that is perpendicular to the ABS. The magnetic moment 262 of the rear bias structure 260 is used to bias the sensor 210 in the stripe height direction. Consequently, the rear bias structure 160 has a magnetic anisotropy in the stripe height direction. Further, the rear bias structure 260 provides sufficient moment to bias the magnetic moments 213 and 217 of the free layers 212 and 216, respectively, in a scissor mode.

The insulating layer 280 resides on top of the rear bias structure 260. The insulating may be provided in step 108. Thus, the insulating layer 280 may have a full film removal rate of not more than fifty Angstroms per minute. In some embodiments, the full film removal rate of the layer 280 is at least three Angstroms per minute and not more than twenty Angstroms per minute. The insulating layer 280 may consist of at least one of silicon nitride, silicon dioxide and tantalum pentoxide.

The magnetic transducer 200 may be suitable for use in high density magnetic recording applications, for example those having a sensor track width of not more than thirty nanometers. The method 100 may be used in fabricating the magnetic transducer 200. Thus, the insulating layer 280 having a low full film removal rate is employed. As a result, manufacturing may be simplified.

Figure 5A:
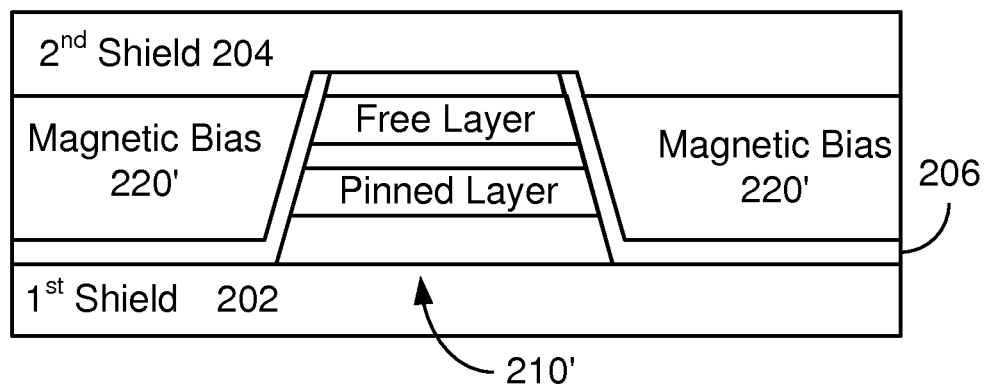
FIGS. 5A and 5B are ABS and side views of another exemplary embodiment of a portion of a magnetic recording read transducer.
Figure 5B:
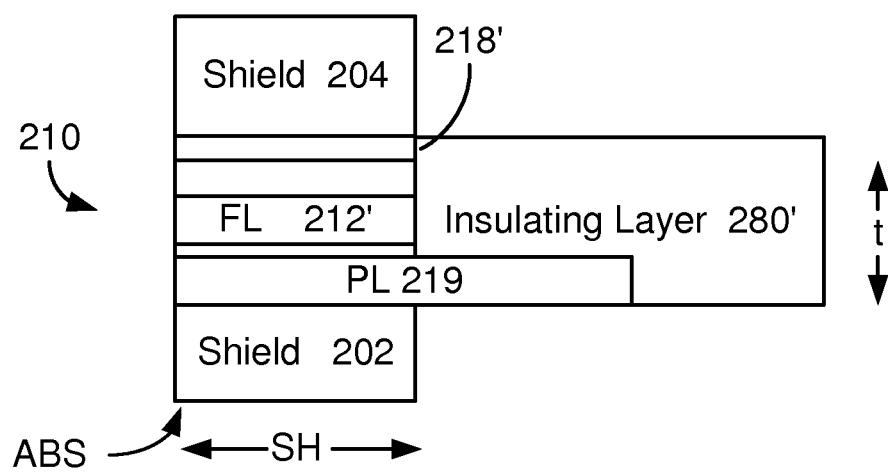

FIGS. 5A-5B depict ABS and side views of another exemplary embodiment of a portion of a magnetic read transducer 200' that may be fabricated using the method 100. For clarity, FIGS. 5A-5B are not to scale. The read transducer 200' may be part of a read head or may be part of a merged head that also includes a write transducer. The head of which the read transducer 200' is a part is contained in a disk drive having a media, a slider and the head coupled with the slider. Further, only a portion of the components of the read transducer 200' are depicted. Portions of the read transducer 200' are analogous to the read transducer 200 and, therefore, labeled similarly.

The transducer 200' includes optional soft magnetic shields 202 and 204, insulator 206, read sensor 210', side bias structures 220' and insulating layer 280' that are analogous to the shields 202 and 204, insulator 206, read sensor 210, side bias structures 220 and insulating layer 280. The read sensor 210' is an extended pinned layer sensor. Thus, the read sensor 210' includes a free layer 212' and pinned layer 219 that extends farther back from the ABS than the stripe height SH of the free layer 212'. The insulating layer 280' is provided in step 108 of the method 100 and thus has a lower removal rate. Further, the side magnetic bias structures 220' provided in step 106 are formed after the read sensor track width TW is defined in step 112. These magnetic bias structures 220' may be configured to bias the free layer in a single direction. There is also no rear magnetic bias structure in the transducer 200'. Thus, step 106 is performed after step 112 during manufacturing of the transducer 200'. The method 100 may be used in fabricating the magnetic transducer 200'. Thus, manufacturing may be simplified.

Figure 6:
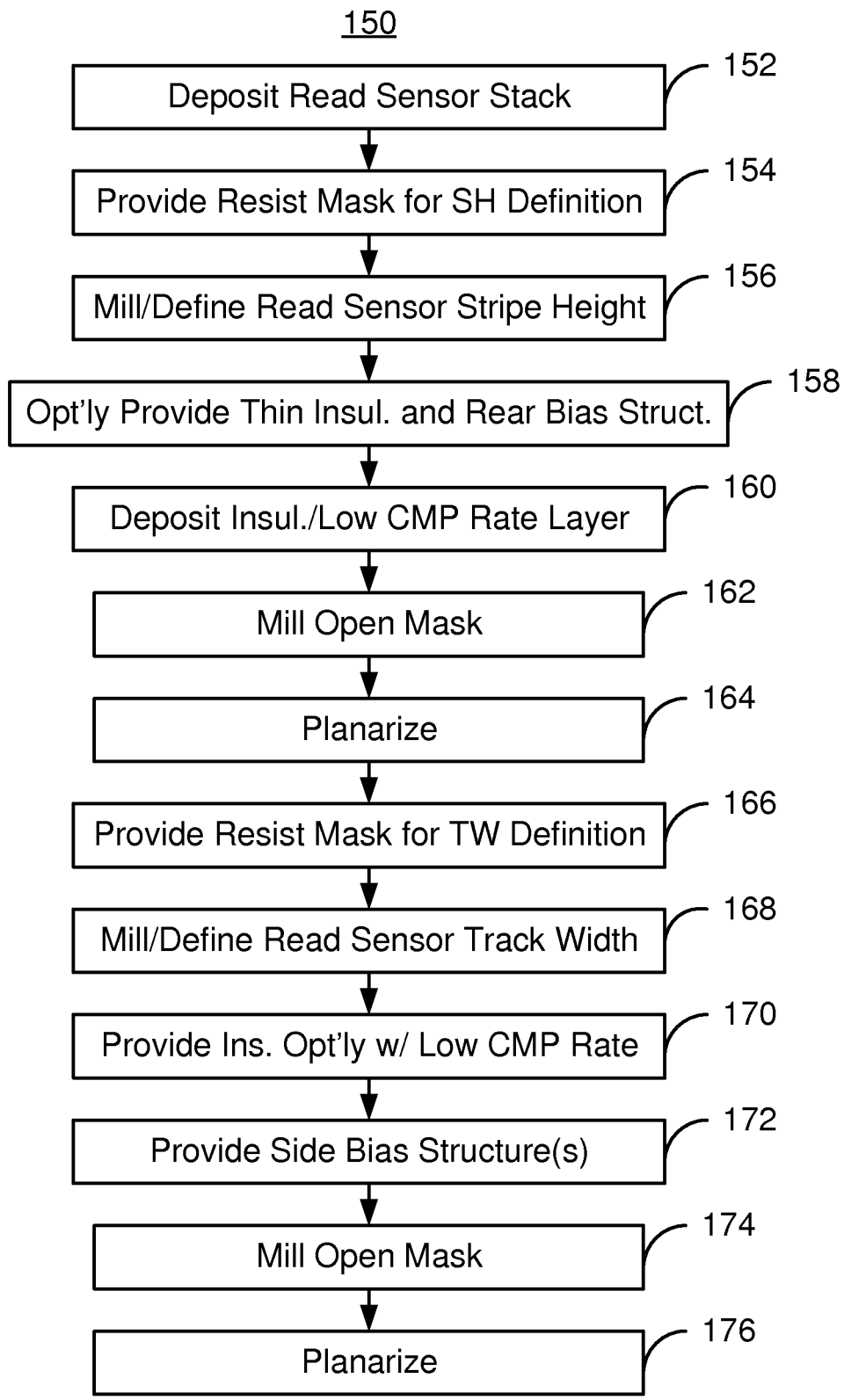
FIG. 6 is flow chart depicting another exemplary embodiment of a method for fabricating a magnetic recording read transducer.

FIG. 6 is flow chart depicting another exemplary embodiment of a method 150 for fabricating a magnetic recording read transducer. For simplicity, some steps may be omitted, interleaved, performed in another order and/or combined. FIGS. 7A-7C through 15A-15C and 16A-16C through 20A-20C depict exemplary embodiments of magnetic transducer 300 and 300', respectively, during formation using the method 150. For clarity, not all parts of the transducer 300 and 300' are shown and FIGS. 7A-7C through 20A-20C are not to scale. The method 150 is also described in the context of providing a single recording transducer 300/300'. However, the method 150 may be used to fabricate multiple transducers at substantially the same time and/or another transducer. The method 150 is also described in the context of particular layers. A particular layer may include multiple materials and/or multiple sub-layers. The method 150 also may start after formation of other portions of the magnetic recording transducer. For example, the method 150 may commence after formation of the bottom shield.

The read sensor stack is provided, via step 152. The layers for the read sensor may be blanket deposited. For example, materials for a first free layer, a nonmagnetic spacer layer, a second free layer and any seed and/or capping layers may be deposited for a dual free layer sensor. Other layers may be deposited for a different read sensor.

Figure 7A:
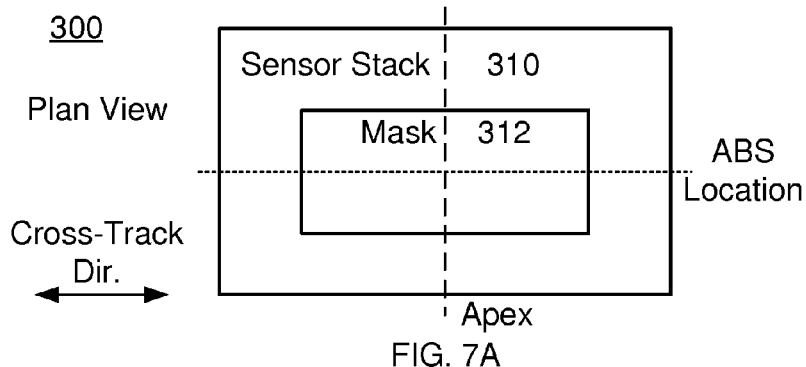
Figure 7B:
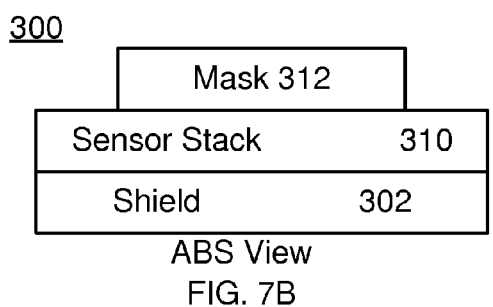
Figure 7C:
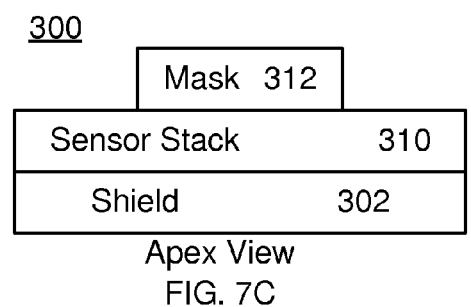

A mask is provided to define the read sensor in the stripe height direction, via step 154. In step 154 a photoresist mask is typically provided. FIGS. 7A-7C depict plan, ABS and apex (side) views of the transducer 300 after step 154 is performed. FIG. 7A includes a dotted line corresponding to the ABS location and a dashed line corresponding to the location of the apex view. The ABS location is the surface that will become the ABS after fabrication of the transducer is completed. A bottom shield 302 and sensor stack 310 have been formed. Also shown is a mask 312 which extends a distance from the ABS location that corresponds to the stripe height of the read sensor. The mask 312 extends further in the cross-track/track width direction at the ABS than the track width of the read sensor.

Figure 8A:
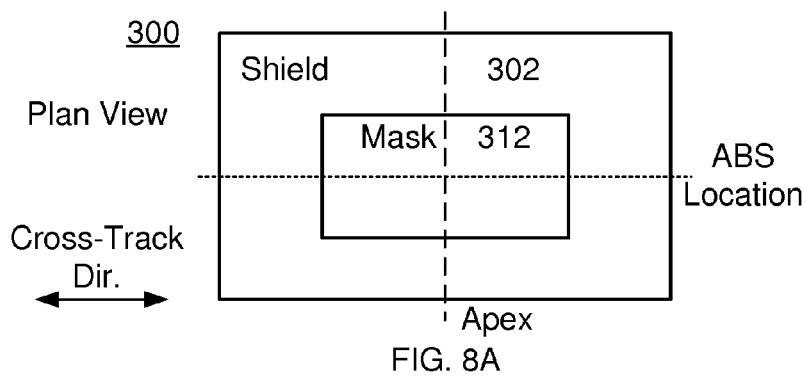
Figure 8B:
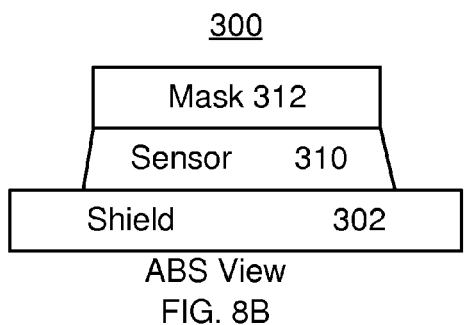
Figure 8C:
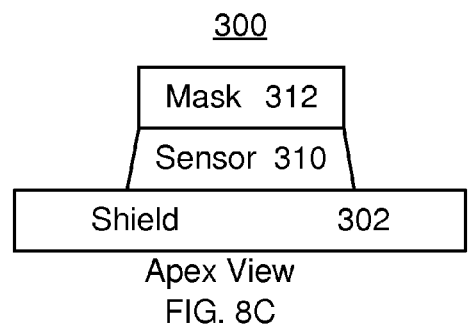

The read sensor stripe height is defined, via step 156. The read sensor stack 310 is, for example, milled while the mask 312 is in place. Thus, the rear surface and stripe height of the read sensor are defined. FIGS. 8A-8C depict plan, ABS and apex (side) views of the transducer 300 after step 156 is performed. FIG. 8A includes a dotted line corresponding to the ABS location and a dashed line corresponding to the location of the apex view. Thus, the exposed portion of the sensor stack has been removed and the sensor 310 defined in the stripe height direction perpendicular to the ABS.

Figure 9A:
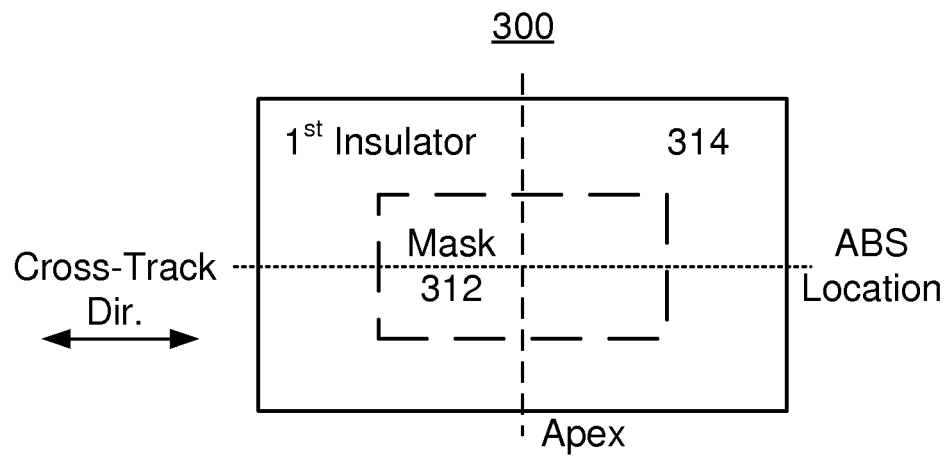
Figure 9B:
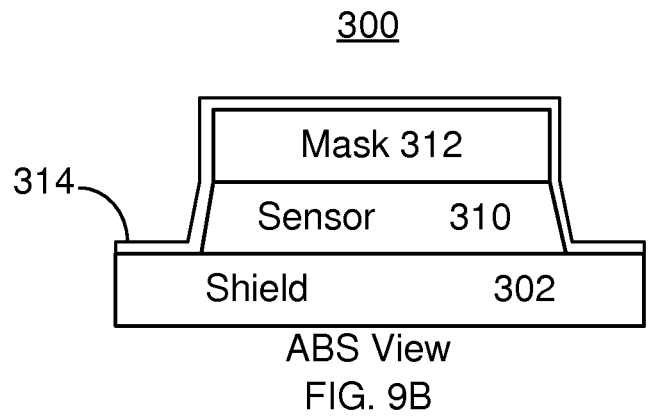
Figure 9C:
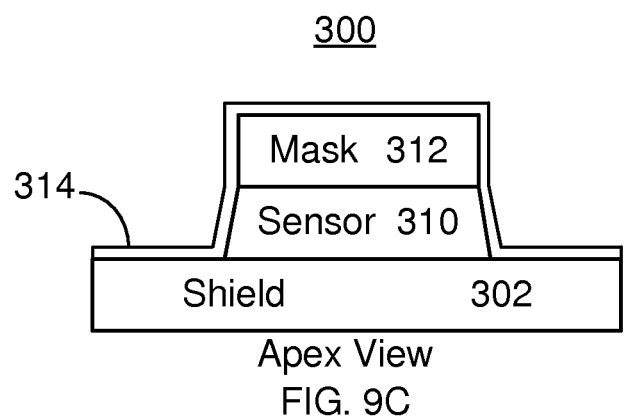
Figure 10A:
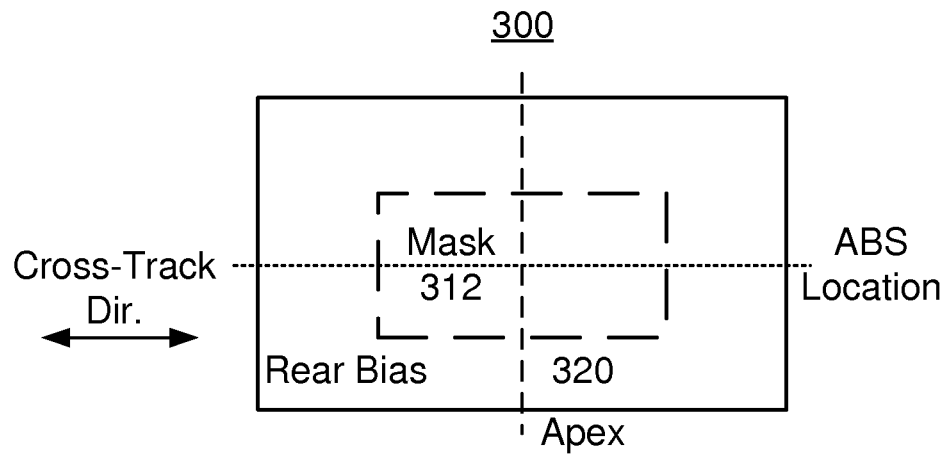
Figure 10B:
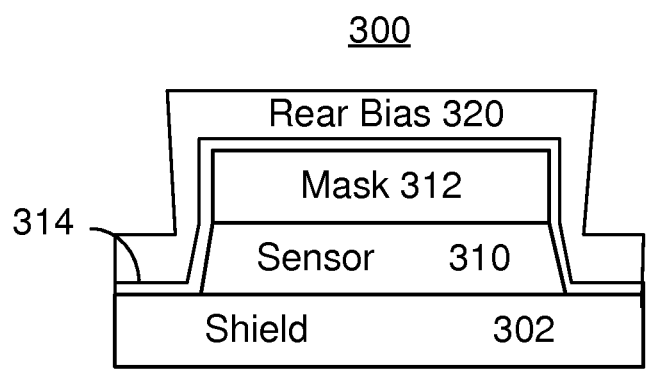
Figure 10C:
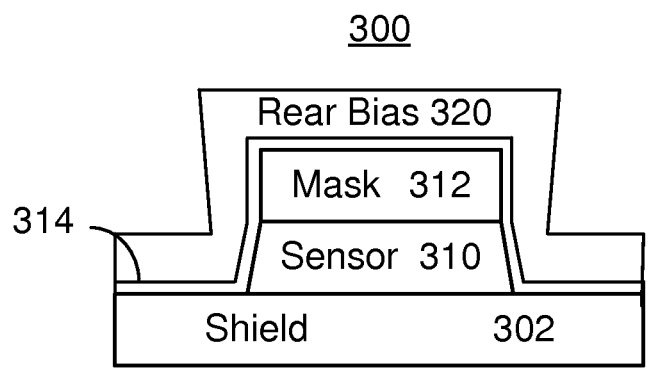

A thin insulating layer and rear bias structure may be deposited, via step 158. Step 158 is performed for a dual free layer sensor or other structure for which a rear bias structure is desired. In other embodiments, the rear bias structure may be replaced by another component desired to be located behind the read sensor and step 158 carried out in a corresponding manner. FIGS. 9A-9C depict plan, ABS and apex (side) views of the transducer 300 during step 158. Thus, insulating layer 314 has been deposited. FIGS. 10A-10C depict plan, ABS and apex (side) views of the transducer 300 after step 158 is performed. Thus, the rear bias 320 is shown.

Figure 11A:
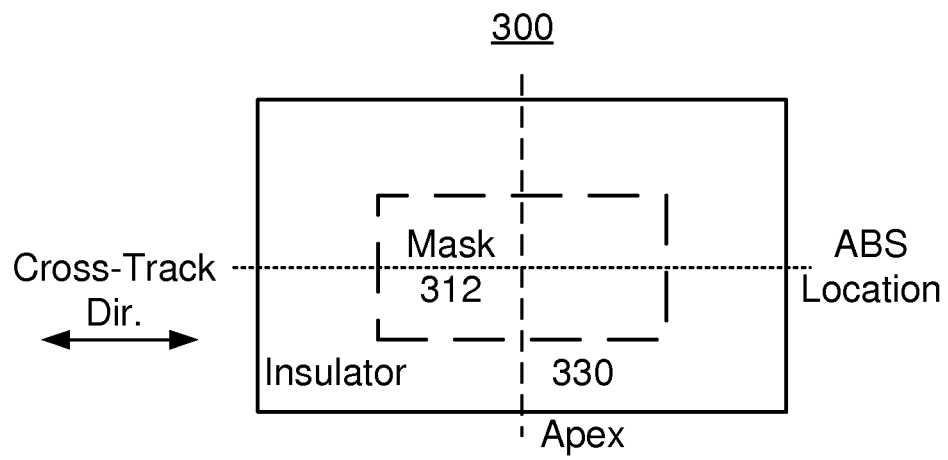
Figure 11B:
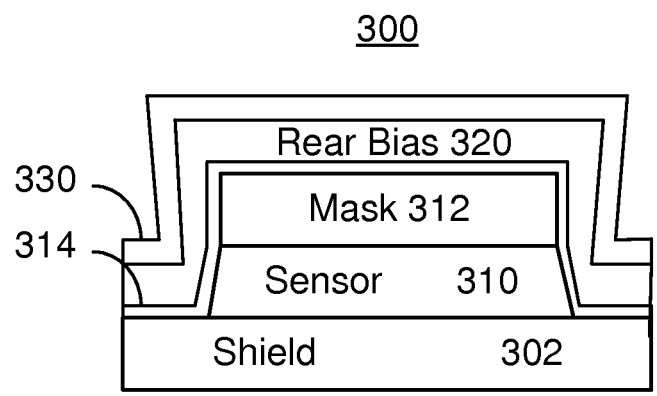
Figure 11C:
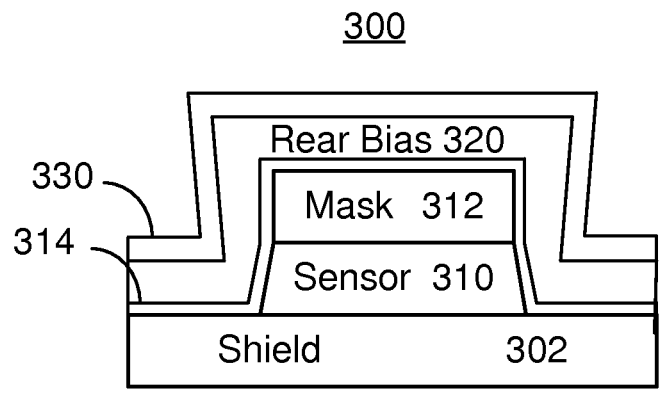

An insulating layer having a low removal rate of not more than fifty Angstroms per minute is deposited on at least the read sensor 310, via step 160. In some embodiments, step 160 includes blanket depositing the insulating layer. FIGS. 11A-11C depict plan, ABS and apex (side) views of the transducer 300 after step 160 is performed. Thus, insulating layer 330 has been provided. In some embodiments, the thickness of the insulating layer is high enough to refill the region around the sensor 310. The insulating layer 330 may include one or more of silicon dioxide, silicon nitride and tantalum pentoxide. In addition, the top surface of the insulating layer 330 is substantially exposed because no metal capping layer is deposited.

Figure 12A:
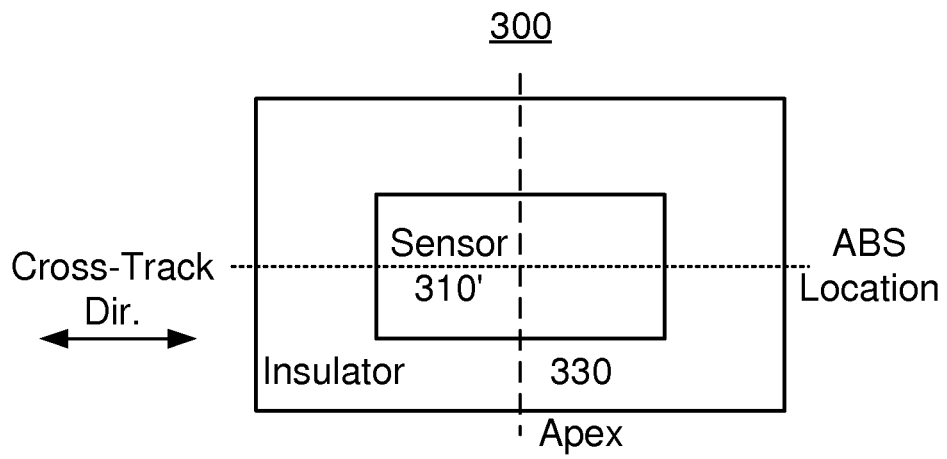
Figure 12B:
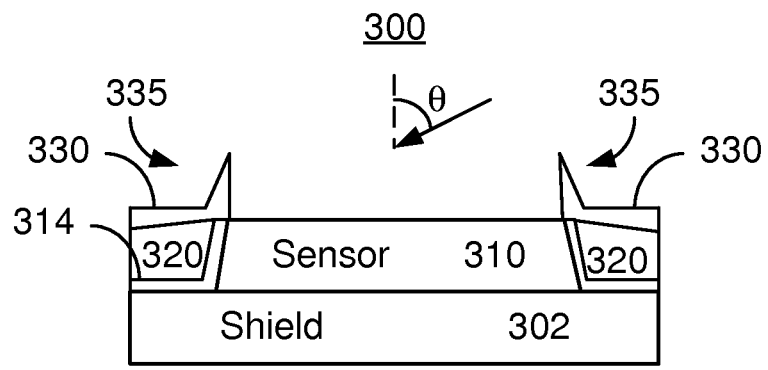
Figure 12C:
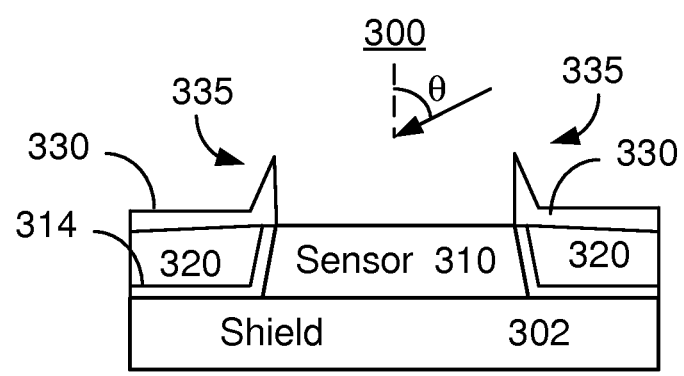

The mask 312 is desired to be removed. Thus, an ion mill at a milling angle that is large with respect to normal to the top surface of the mask 312 may be performed, via step 162. A lift-off process may also be performed as part of step 162. FIGS. 12A-12C depict plan, ABS and apex (side) views of the transducer 300 after step 162 is performed. Also shown is the direction that the mill in step 162. Thus, the milling may be at the milling angle, θ. Thus, fencing 335 remains after the mask has been removed.

Figure 13A:
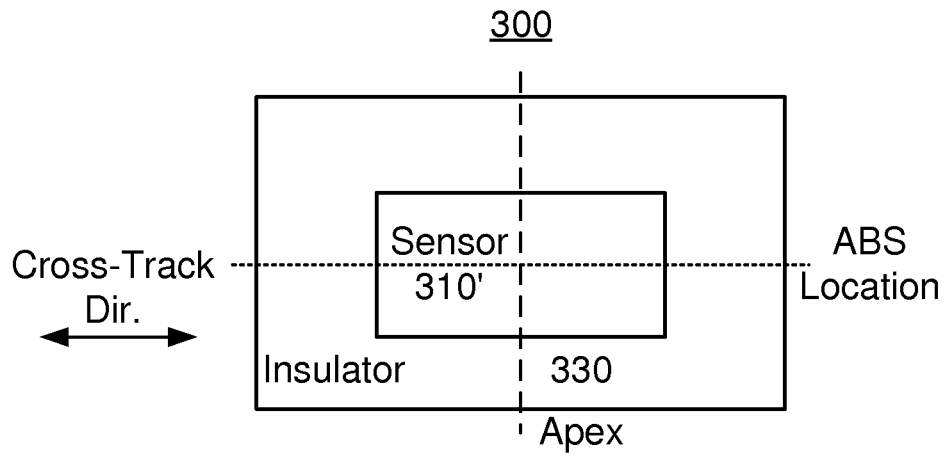
Figure 13B:
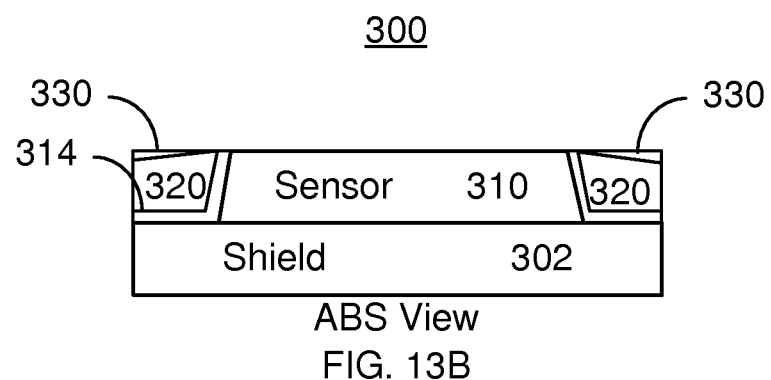
Figure 13C:
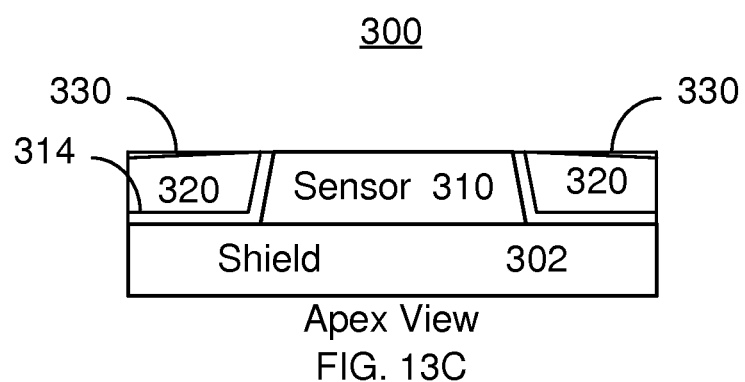

The portion of the transducer 300 that has been fabricated is planarized, via step 164. Step 164 typically include performing a CMP configured to remove the insulating layer 330. FIGS. 13A-13C depict plan, ABS and apex (side) views of the transducer 300 after step 164 has been completed. Thus, the fencing 335 has been removed. However, a substantial portion of the insulating layer 330 still remains.

Figure 14A:
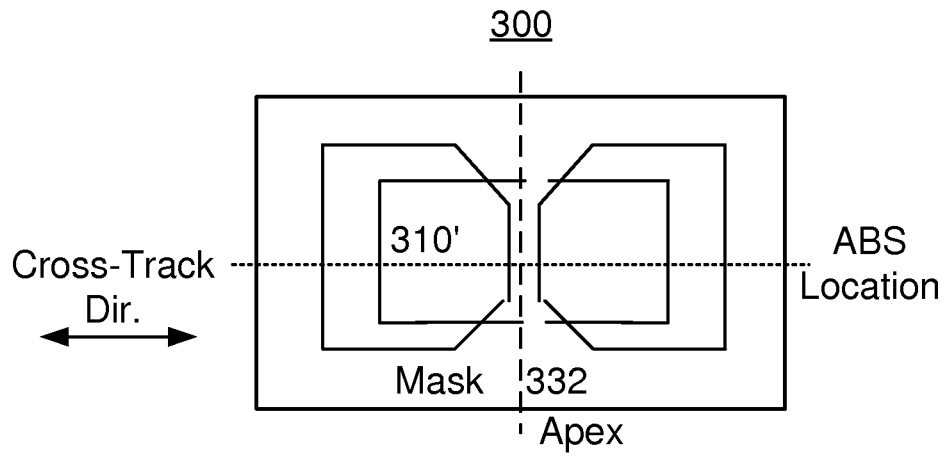
Figure 14B:
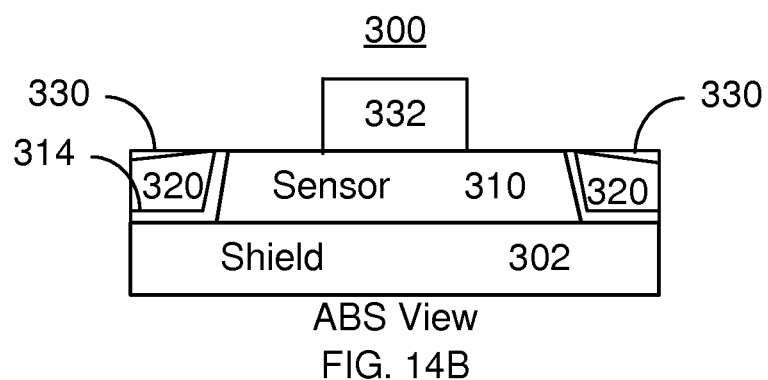
Figure 14C:
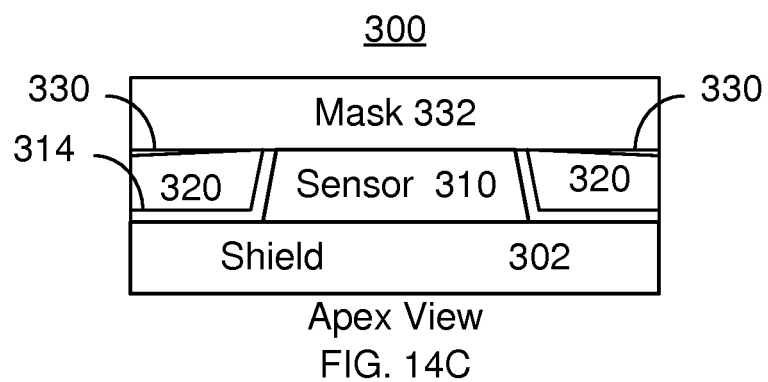

A mask is provided for defining the track width of the read sensor 310, via step 166. Step 166 generally include providing a photoresist mask. However, a hard mask or other mask might be used. FIGS. 14A-14C depict plan, ABS and apex (side) views of the transducer 300 after step 166 is performed. Thus, a mask 332 has been formed. The mask 332 covers a portion of the ABS location at which the read sensor 310 is to be formed (where dashed and dotted lines cross in FIG. 14A) as well as a frame in regions further from the sensor 310.

Figure 15A:
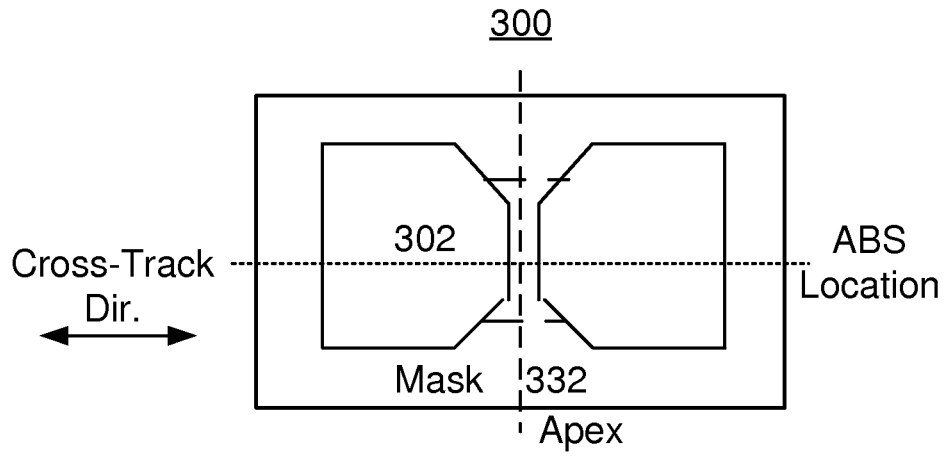
Figure 15B:
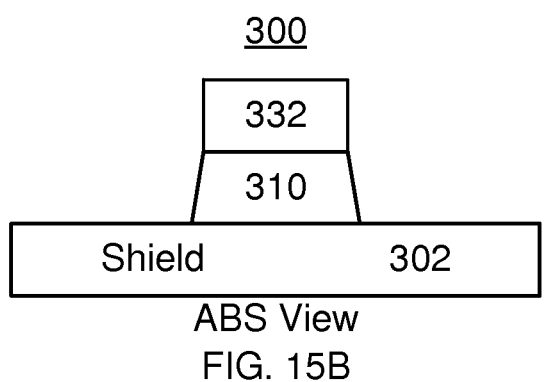
Figure 15C:
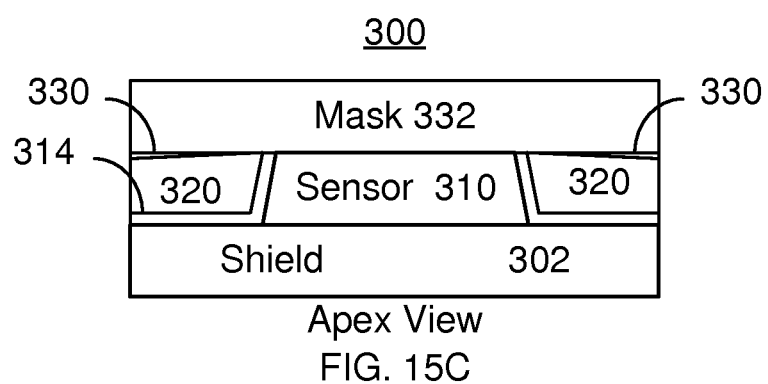

The read sensor 310 is then defined in the track width direction, via step 168. Step 168 typically includes milling the portion of the read sensor 310 exposed by the mask 332. FIGS. 15A-15C depict plan, ABS and apex (side) views of the transducer 300 after step 168 is performed. Thus, the read sensor 310 has been defined in the track width and stripe height directions. Further, the rear bias structure 320 has been defined in the track width direction. Thus, the rear bias structure 320 and read sensor 310 may have the same width in the cross-track direction. Note that the insulating layer 330 is also defined in step 168 because the layer 330 resides on the rear bias structure 320.

Figure 16A:
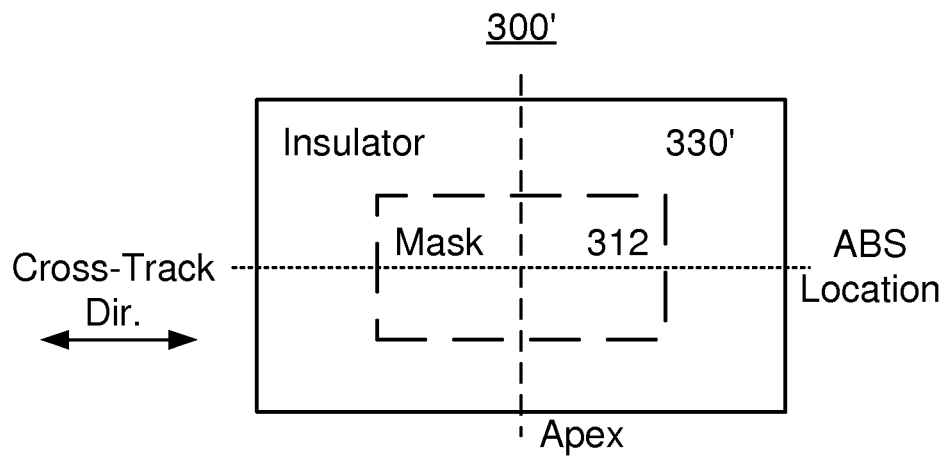
Figure 16B:
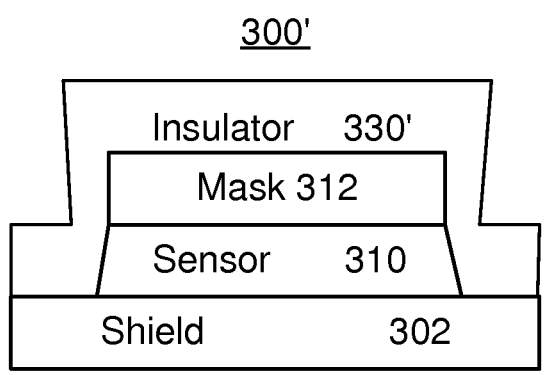
Figure 16C:
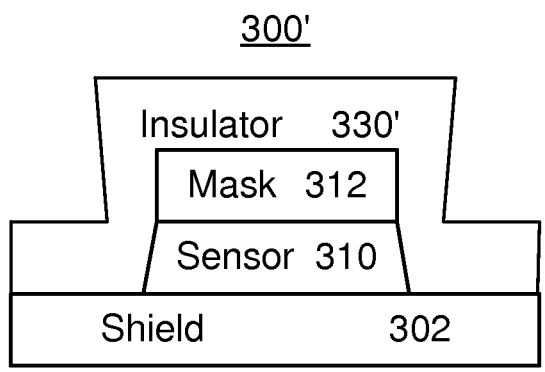
Figure 17A:
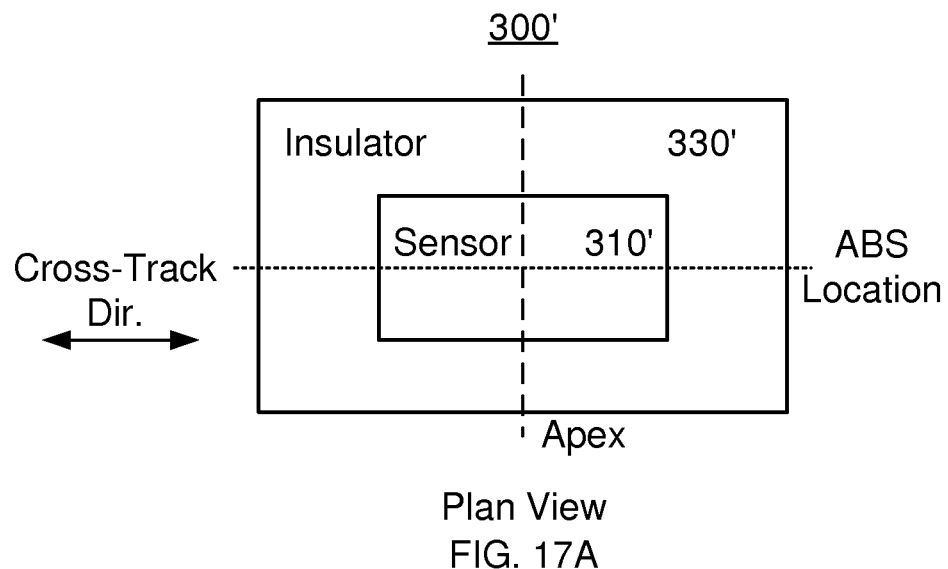
Figure 17B:
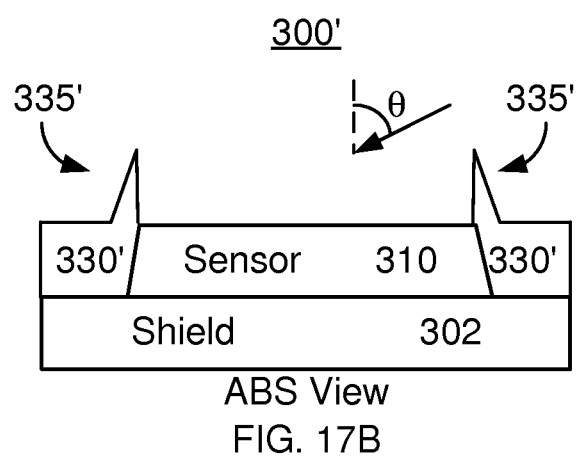
Figure 17C:
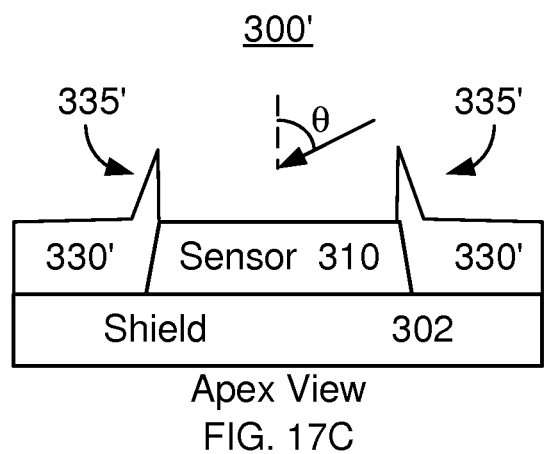
Figure 18A:
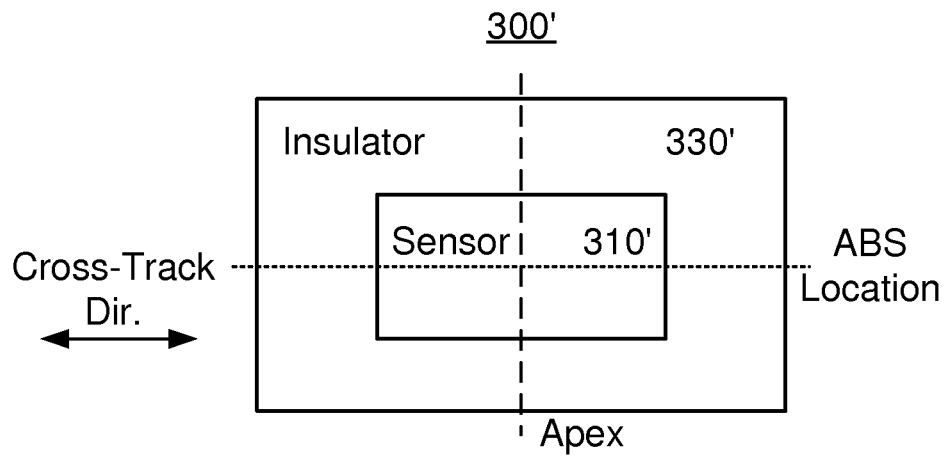
Figure 18B:
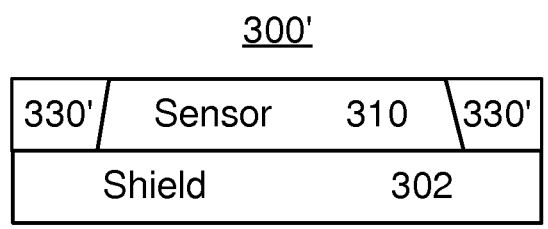
Figure 18C:
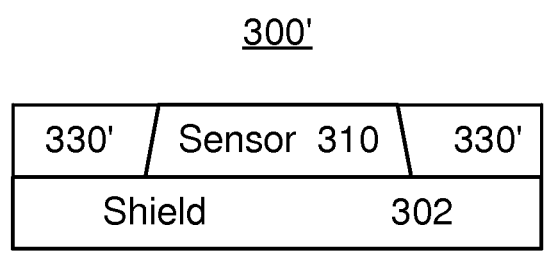
Figure 19A:
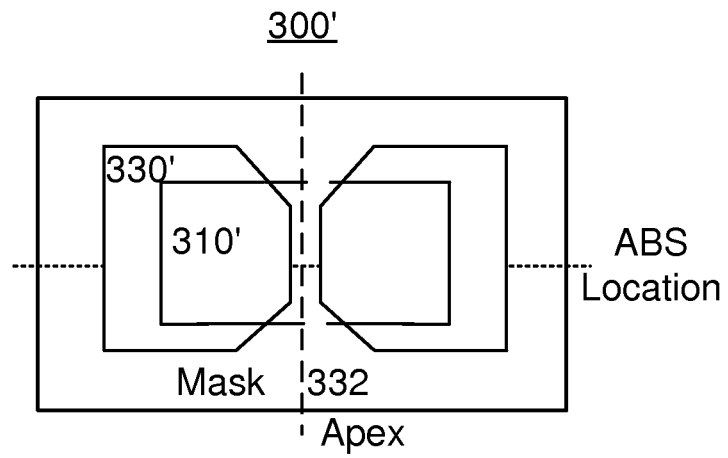
Figure 19B:
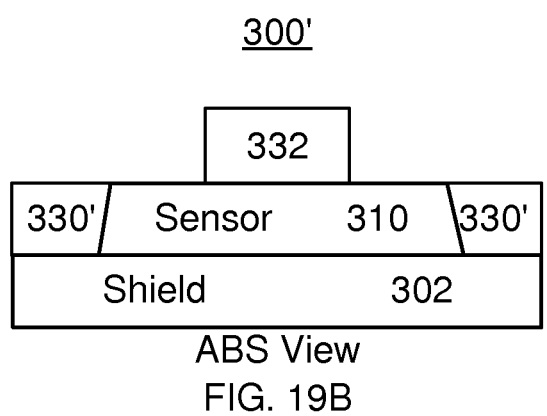
Figure 19C:
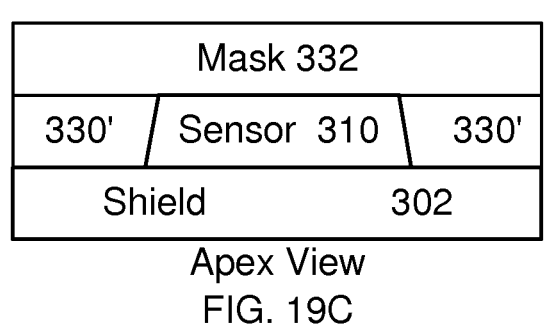
Figure 20A:
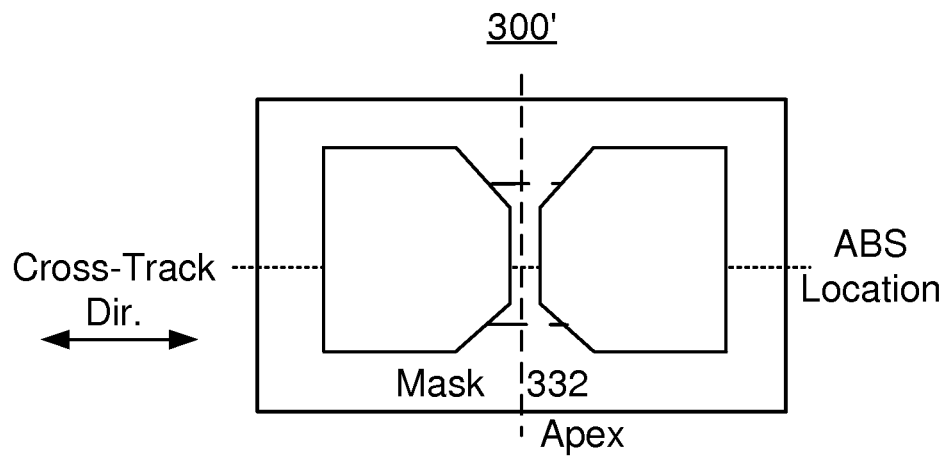
Figure 20B:
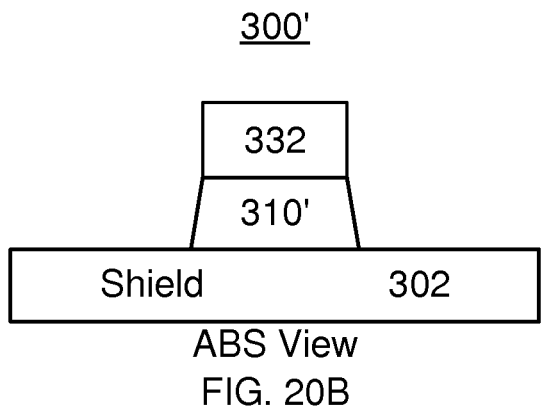
Figure 20C:
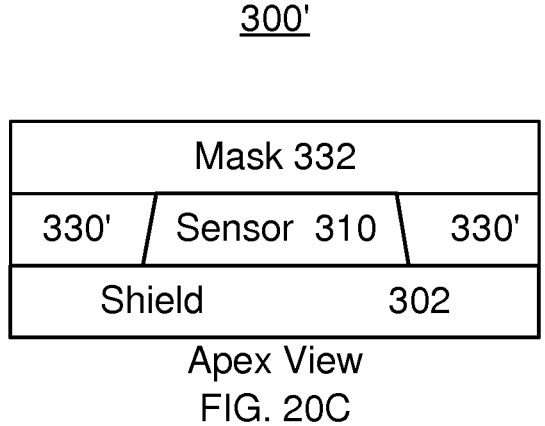

FIGS. 16A-16C through 20A-20C depict plan, ABS and apex (side) views of the transducer 300' in which a rear bias structure is not fabricated. Thus, step 158 may be skipped. FIGS. 16A-16C depict plan, ABS and apex (side) views of the transducer 300' after step 160 is performed when step 158 is skipped. Thus, for the transducer 300', a rear bias structure may not be desired. In the transducer 300', the sensor 310 may, for example, be an extended pinned layer sensor. Thus, the insulating layer 330' may adjoin the sensor 310. However, the thickness of the insulating layer 330' may still be desired to be such that the top surface of the insulating layer 330' is substantially the same distance from the shield 302 as the top surface of the sensor 310. FIGS. 17A-17C depict plan, ABS and apex (side) views of the transducer 300' after step 162 is performed. Thus, the mask 312 has been removed and fencing 335' is adjacent to the sensor 310. Also shown is the direction that the mill in step 162. Thus, the milling may be at the milling angle, θ. FIGS. 18A-18C depict plan, ABS and apex (side) views of the transducer 300' after step 164 has been performed. Thus, the insulating layer 330' has been planarized and fencing 335' removed. FIGS. 19A-19C depict plan, ABS and apex (side) views of the transducer 300' after step 166 is performed. Thus, the mask 332 is present. FIGS. 20A-20C depict plan, ABS and apex (side) views of the transducer 300' after step 168 is performed. Thus, the read sensor 310 has been defined in the track width and stripe height directions. Further, the insulating layer 330' has been defined in the track width direction. Thus, the insulating layer 330' and read sensor 310 may have the same width in the cross-track direction. Thus, after step 168 is performed, the read sensor 310 and, if present, the rear bias structure 320 have been defined in the track width directions. For the transducers 300 and 300', some portion of the insulating layer 330 and 330', respectively, remains.

An additional insulator for the sidewalls of the read sensor 310 in the track width direction is desired. Thus, the additional insulator is provided in step 170. In some embodiments, the insulator providing in step 170 may have the same properties as the insulating layer 330/330'. Thus, the insulator provided in step 170 may have a low full film removal rate and include the materials discussed above. The side bias structures may be provided, via step 172. For a dual free layer transducer, the side bias structures may be analogous to the side bias structures 120. In other embodiments, the side bias structures might be analogous to the side bias structures 120'. Another milling step which exposes the underlying mask 332 is performed, via step 174. In some embodiments, step 174 may be performed at a milling angle that is the same as the milling angle, θ, for step 162. A planarization may also be performed, via step 176. Step 176 may be analogous to step 164. Fabrication of the transducer(s) 300 and/or 300' may then be completed.

Using the method 150, the magnetic bias structure(s) and read sensor may be fabricated. Use of an insulating layer having a low full film removal rate in lieu of a combination of an insulator and a metal stop layer may simplify the fabrication process. In addition, any step height between the planarized insulating layer and the top of the read sensor after step may be reduced. Thus, a flatter surface may be provided for subsequent processing, including definition of the track width. Moreover, use of the insulating layer may improve formation of the mask used in defining the read track width. Because no metal capping layer may be used, a less varied surface having a more consistent optical contrast are present before formation of a photoresist mask used in track width definition. Thus, photolithography may be improved. Consequently, controllability and manufacturability of the transducers 300 and/or 300' may be improved.

We claim:

1. A method for providing a magnetic read apparatus having an air-bearing surface (ABS) and comprising:
   providing a read sensor stack for a read sensor of the read device;
   defining a read sensor from the read sensor stack in a stripe height direction, the stripe height direction being perpendicular to the ABS;
   providing at least one magnetic bias structure;
   depositing an insulating layer on the read sensor, the insulating layer having a full film removal rate of not more than fifty Angstroms per minute, the insulating layer having a top surface;
   planarizing the insulating layer, at least a portion of the top surface of the insulating layer being exposed at the start of the planarizing; and
   defining at least the read sensor in a track width direction.

2. The method of claim 1 wherein the at least one magnetic bias structure includes a rear magnetic bias structure and wherein the step of defining at least the read sensor in the track width direction further includes:
   defining the read sensor and the rear magnetic bias structure in the track width direction, a portion of the rear magnetic bias structure being between the insulating layer and the read sensor, the read sensor being between the rear magnetic bias structure and the ABS.

3. The method of claim 2 wherein the step of providing the at least one magnetic bias structure further includes:
   providing a side bias structure after the step of defining the at least the read sensor in the track width direction.

4. The method of claim 3 wherein the read sensor includes a dual free layer read sensor.

5. The method of claim 2 wherein the rear magnetic bias structure includes a soft magnetic bias structure.

6. The method of claim 2 wherein the rear magnetic bias structure includes a hard magnetic bias structure.

7. The method of claim 2 wherein the step of providing the at least one magnetic bias structure further includes:
   providing an insulator between the read sensor and the rear magnetic bias structure.

8. The method of claim 1 wherein the step of planarizing the insulating layer further includes:
   performing a chemical mechanical planarization (CMP) step on the insulating layer, the top surface of the insulating layer being exposed at the start of the CMP.

9. The method of claim 1 wherein the insulating layer consists of at least one of silicon nitride, silicon dioxide and tantalum pentoxide.

10. The method of claim 1 wherein the full film removal rate of the insulating layer is at least three Angstroms per minute and not more than twenty Angstroms per minute.

11. A method for providing a read device having an air-bearing surface (ABS) and comprising:
    providing a read sensor stack for a read sensor of the read device;
    defining a read sensor from the read sensor stack in a stripe height direction, the stripe height direction being perpendicular to the ABS;
    depositing an insulator on at least the read sensor after the step of defining the read sensor in the stripe height direction;
    providing a rear magnetic bias structure, the read sensor being between the rear magnetic bias structure and the ABS, a portion of the insulator being between the rear magnetic bias structure and the read sensor;
    depositing an insulating layer on the rear magnetic bias structure, the insulating layer having a full film removal rate of at least three Angstroms per minute and not more than twenty Angstroms per minute, the insulating layer consisting of at least one of silicon dioxide, silicon nitride and tantalum pentoxide, the insulating layer having a top surface;
    performing a chemical mechanical planarization (CMP) step on the insulating layer, the top surface of the insulating layer being exposed at the start of the CMP step;
    defining the read sensor and the rear magnetic bias structure in a track width direction after the CMP step;
    providing an additional insulating layer after the step of defining the read sensor and the rear magnetic bias structure; and
    providing a side bias structure after the step of defining the at least the read sensor in the track width direction, a portion of the additional insulating layer being between the side bias structure and the read sensor.

12. The method of claim 11 wherein the read sensor is a dual free layer read sensor.

13. The method of claim 11 wherein the rear magnetic bias structure includes a soft magnetic bias structure.

14. The method of claim 11 wherein the rear magnetic bias structure includes a hard magnetic bias structure.

15. A magnetic read apparatus having an air-bearing surface (ABS) comprising:
    a read sensor including a first free layer, a spacer layer, and a second free layer, the spacer layer being nonmagnetic and residing between the first free layer and the second free layer, the read sensor having at least one side surface and a rear surface opposite to the ABS;
    a side bias structure adjacent to the at least one side surface, the side bias structure being configured to magnetically bias the first free layer and the second free layer to be antiferromagnetically aligned;
    a rear magnetic bias structure configured to bias the first free layer and the second free layer in a scissor mode, the read sensor being between the ABS and the rear magnetic bias structure; and
    an insulating layer, at least a portion of the insulating layer being on the rear magnetic bias structure, the insulating layer having a full film removal rate of not more than fifty Angstroms per minute.

16. The magnetic read apparatus of claim 15 wherein the insulating layer consists of at least one of silicon nitride, silicon dioxide and tantalum pentoxide.

17. The magnetic read apparatus of claim 15 wherein the full film removal rate of the insulating layer is as low as three Angstroms per minute and not more than twenty Angstroms per minute.

* * * * *